United States Patent [19]
Dent

[11] Patent Number: 5,351,016
[45] Date of Patent: Sep. 27, 1994

[54] ADAPTIVELY SELF-CORRECTING MODULATION SYSTEM AND METHOD

[75] Inventor: Paul W. Dent, Stehag, Sweden

[73] Assignee: Ericsson GE Mobile Communications Inc., Research Triangle Park, N.C.

[21] Appl. No.: 68,087

[22] Filed: May 28, 1993

[51] Int. Cl.$^5$ .......................... H03C 3/00; H03C 3/02
[52] U.S. Cl. .................... 332/103; 332/107; 332/123; 332/159; 375/60
[58] Field of Search ............... 332/100, 103, 107, 104, 332/105, 123, 144, 159, 162; 375/58, 60

[56] References Cited

U.S. PATENT DOCUMENTS

| | | | |
|---|---|---|---|
| 4,581,749 | 4/1986 | Carney et al. | 375/44 |
| 4,856,025 | 8/1989 | Takai | 375/40 |
| 4,899,367 | 2/1990 | Sampei | 375/39 |
| 4,953,182 | 8/1990 | Chung | 375/97 |
| 4,985,688 | 1/1991 | Nagata | 332/123 |
| 5,020,076 | 5/1991 | Cahill et al. | 375/5 |
| 5,048,059 | 9/1991 | Dent | 375/94 |
| 5,084,669 | 1/1992 | Dent | 324/83 D |
| 5,105,445 | 4/1992 | Karam et al. | 332/107 X |
| 5,148,373 | 9/1992 | Dent | 364/484 |
| 5,148,448 | 9/1992 | Karam et al. | 332/107 X |
| 5,151,919 | 9/1992 | Dent | 375/1 |
| 5,218,619 | 6/1983 | Dent | 375/1 |
| 5,249,200 | 9/1993 | Chen et al. | 329/349 X |
| 5,293,406 | 3/1994 | Suzuki | 375/60 X |

OTHER PUBLICATIONS

K. Gilhousen et al., "On the Capacity of a Cellular CDMA System," IEEE Transactions on Vehicular Technology, vol. 40, No. 2, pp. 303-312 (May 1991).

S. Gronemeyer, "MSK and Offset OPSK Modulation," IEEE Transactions on Communications, vol. COM-24, No. 8, pp. 809-820 (Aug. 1976).

F. Stremler, Introduction to Communictions Systems, 2d. Ed., Addison-Wesley Publishing Co., Reading, Mass., pp. 590-596 (1982).

Primary Examiner—David Mis
Attorney, Agent, or Firm—Burns, Doane, Swecker & Mathis

[57] ABSTRACT

A self-adjusting quadrature modulator and modulation method improve the accuracy with which digital data is impressed on an RF carrier, which is particularly useful for systems having Viterbi, echo-integrating demodulators and for systems using subtractive CDMA techniques. The method and apparatus involve receiving one's own transmission with a suitable modulation assessment receiver and determining the modulation error relative to the theoretically perfect transmission expected by the receiver. The measured error is used to adjust the modulation to minimize the error. The modulation assessment receiver may use log-polar signal processing to measure phåse and (log)amplitude instead of cartesian I and Q components, and then convert to cartesian form. In addition, correction factors determined by the modulation assessment receiver can be directly identified with certain transform components produced by the Fast Walsh Transform.

25 Claims, 9 Drawing Sheets

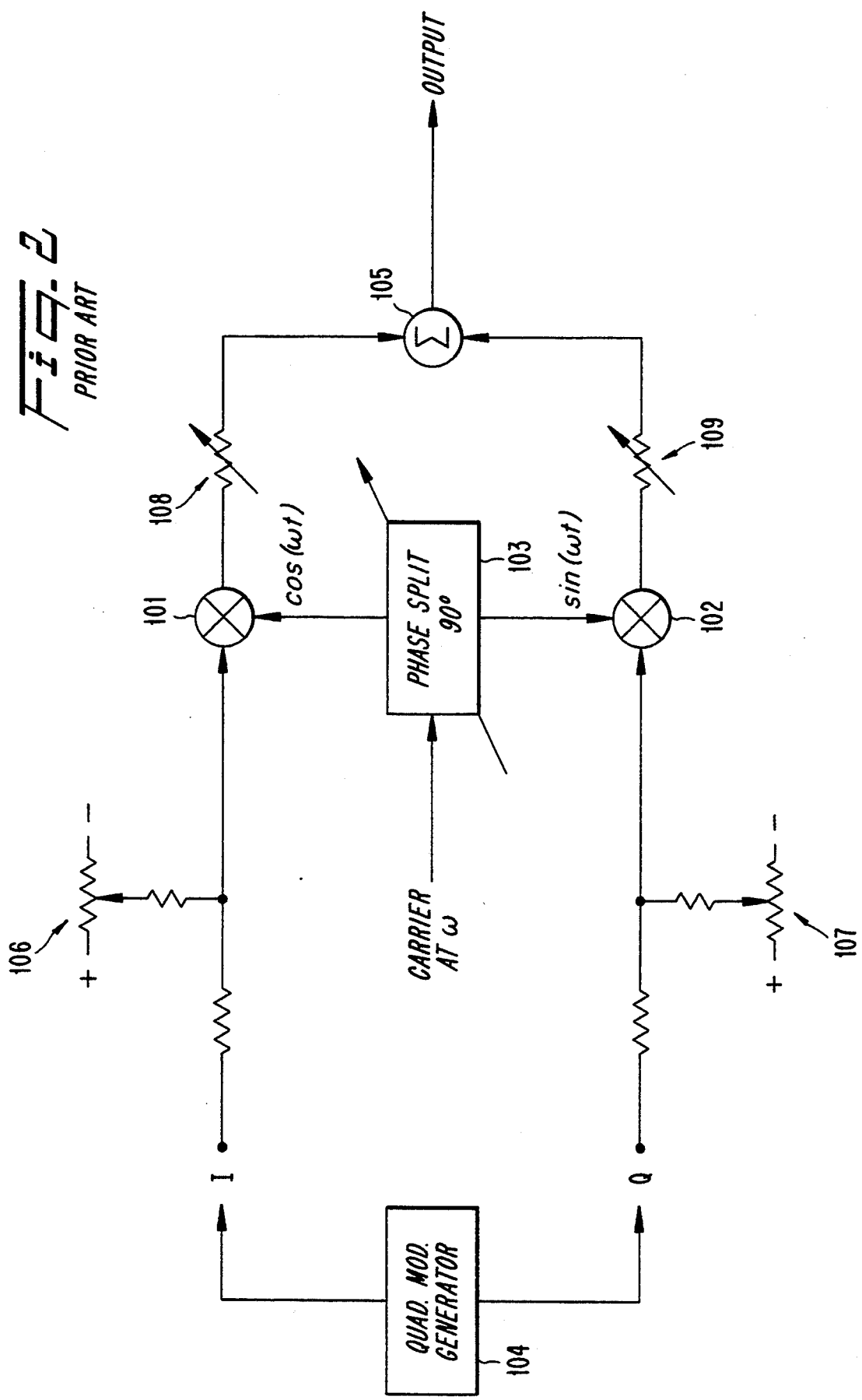

Fig. 5

(a) PRODUCT OF SIGNAL 1 AND CODE 1.

(b) PRODUCT OF SIGNAL 2 AND CODE 2.

(c) SUM OF CODED SIGNALS 1 AND 2.

(d) CODE FOR SIGNAL 1.

(e) PRODUCT OF SUM WITH SIGNAL 1'S CODE.

(f) AVERAGE = 1  AVERAGE = 0  AVERAGE = 0.75  AVERAGE = 1.25
DECISION = +  DECISION = ?  DECISION = +  DECISION = +

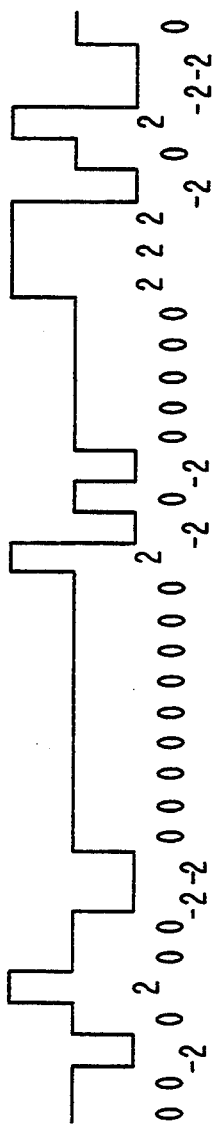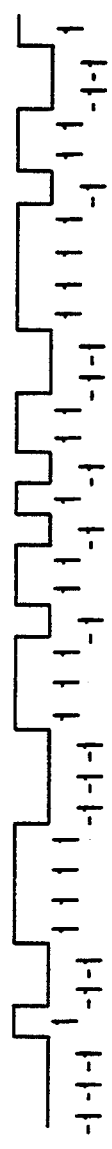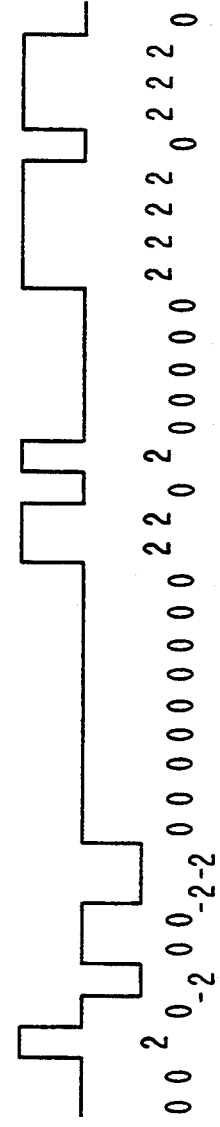
(a) SUM OF CODED SIGNALS 1 AND 2.
(b) CODE FOR SIGNAL 2.
(c) PRODUCT OF SUM WITH SIGNAL 2'S CODE.
(d) AVERAGE = −0.75  DECISION = −
AVERAGE = 0.25  DECISION = +
AVERAGE = 0.5  DECISION = +
AVERAGE = 1.75  DECISION = +
Fig. 6

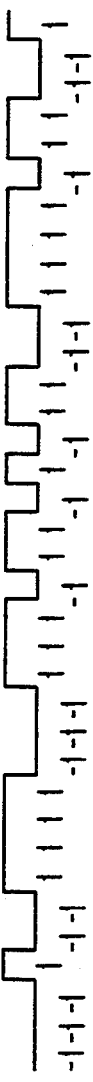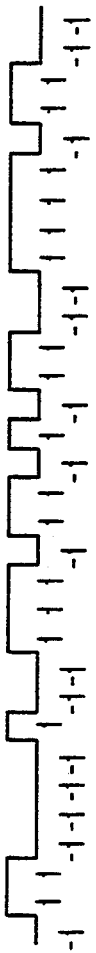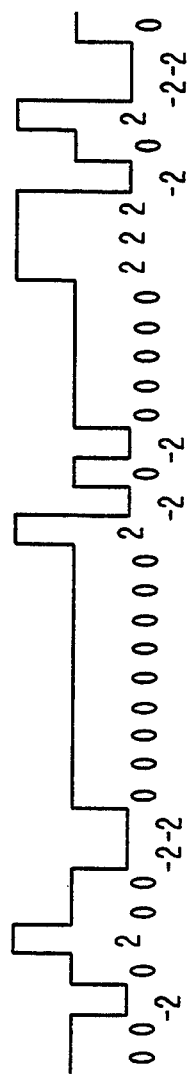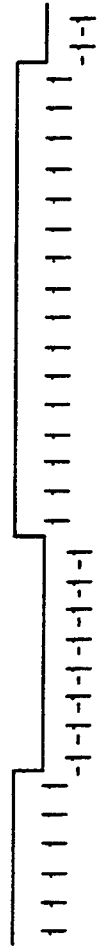
Fig. 7

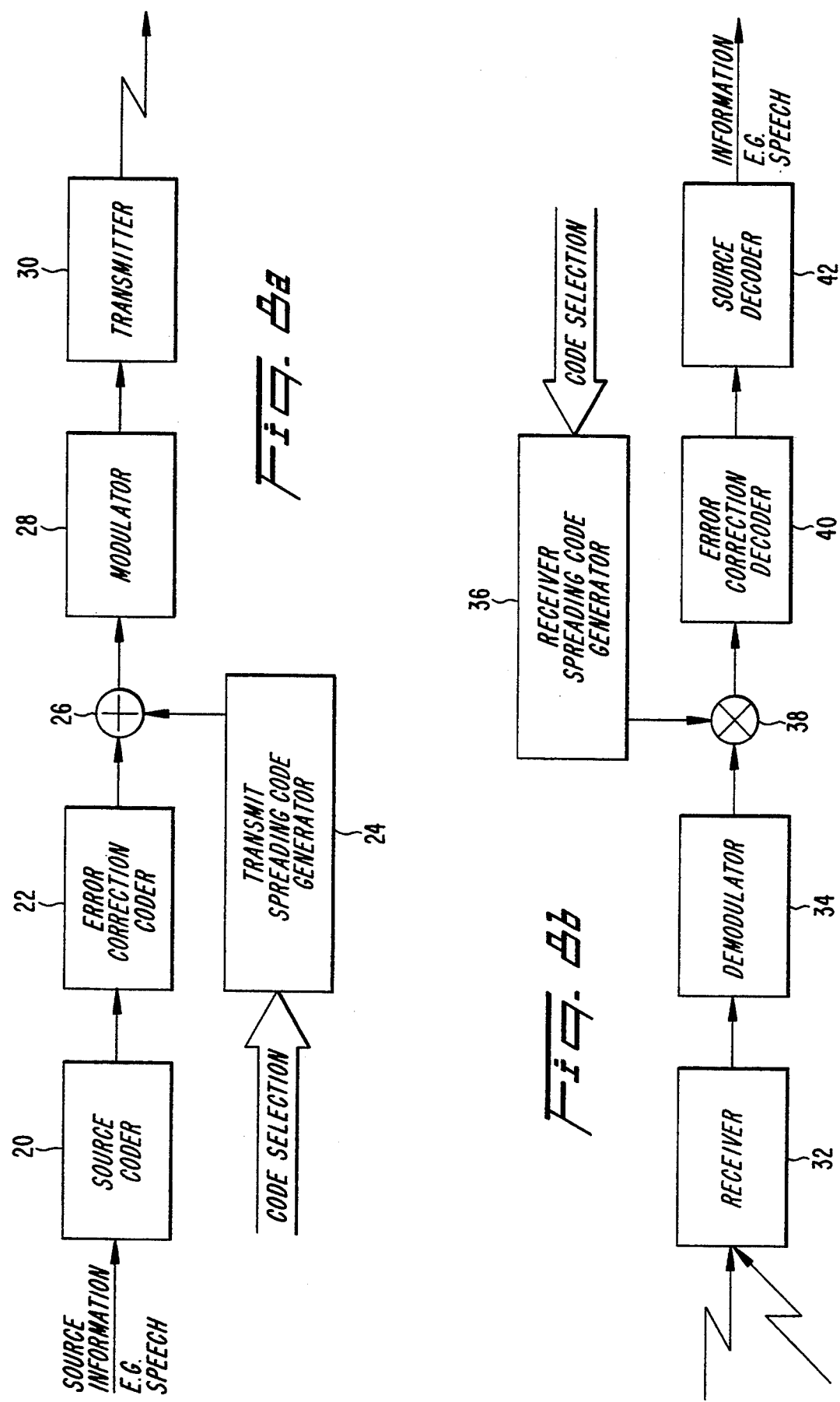

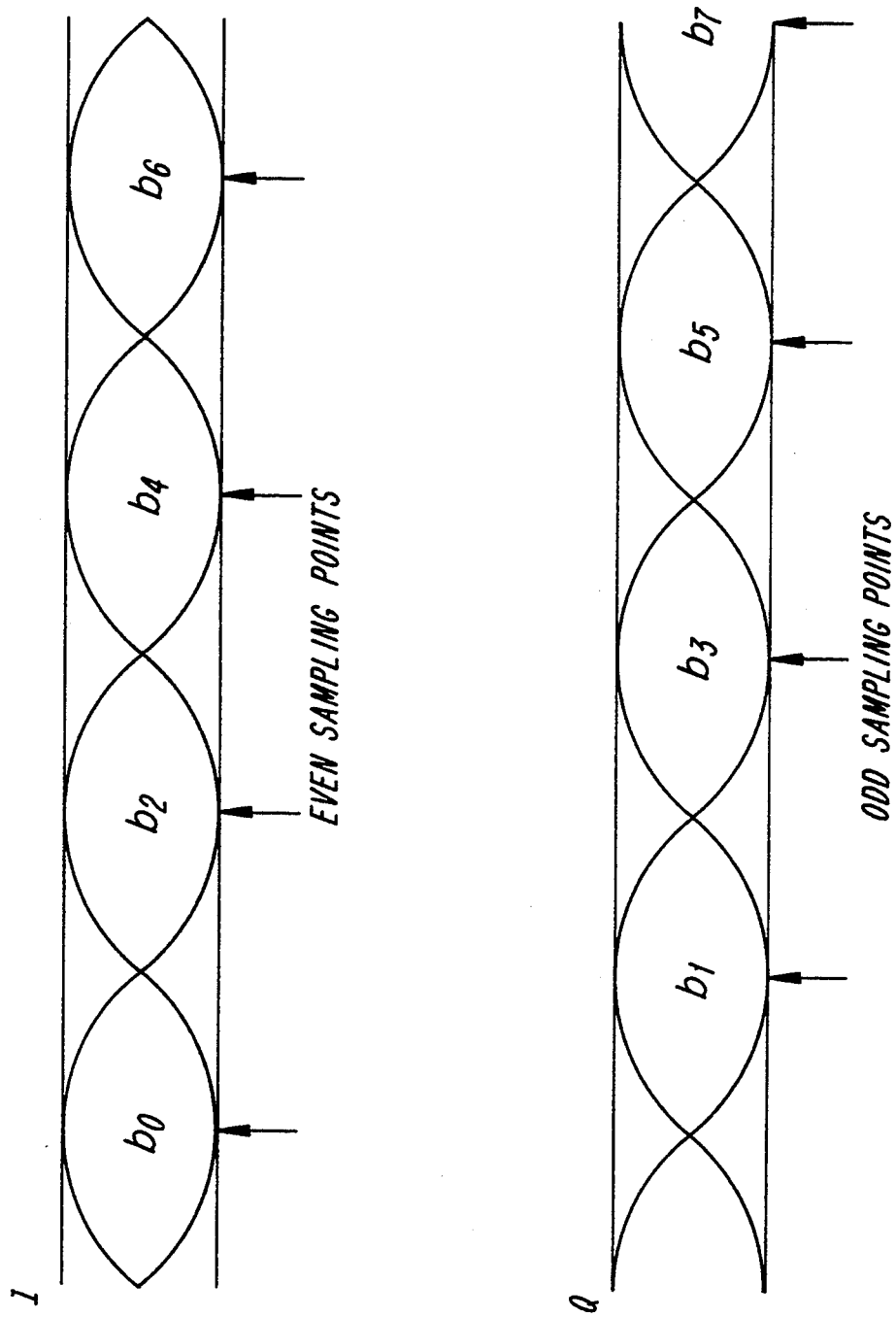

ADAPTIVELY SELF-CORRECTING MODULATION SYSTEM AND METHOD

The present invention relates to radio transmitters optimized for digital data transmission, and more particularly, to improving the accuracy with which digital data may be impressed on a radio carrier frequency wave by means of a quadrature modulator. Improved accuracy of digital data impression on radio carrier frequency waves is especially important and useful for recent developments in Viterbi, echo-integrating demodulators and in subtractive demodulation of Code Division Multiple Access (CDMA) modulations.

BACKGROUND

The cellular telephone industry has made phenomenal strides in commercial operations in the United States as well as the rest of the world. Growth in major metropolitan areas has far exceeded expectations and is outstripping system capacity. If this trend continues, the effects of rapid growth will soon reach even the smallest markets. Innovative solutions are required to meet these increasing capacity needs as well as maintain high quality service and avoid rising prices.

Throughout the world, one important step in cellular systems is to change from analog to digital transmission. Equally important is the choice of an effective digital transmission scheme for implementing the next generation of cellular technology. Furthermore, it is widely believed that the first generation of Personal Communication Networks (PCNs), (employing low cost, pocket-size, cordless telephones that can be carried comfortably and used to make or receive calls in the home, office, street, car, etc.), would be provided by the cellular carriers using the next generation digital cellular system infrastructure and the cellular frequencies. The key feature demanded in these new systems is increased traffic capacity.

Currently, channel access is achieved using Frequency Division Multiple Access (FDMA) and Time Division Multiple Access (TDMA) methods. As illustrated in FIG. 1(a), in FDMA, a communication channel is a single radio frequency band into which a signal's transmission power is concentrated. Interference with adjacent channels is limited by the use of band pass filters which only pass signal energy within the specified frequency band. Thus, with each channel being assigned a different frequency, system capacity is limited by the available frequencies as well as by limitations imposed by channel reuse.

In TDMA systems, as shown in FIG. 1(b), a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the problem of interference from different relative signal strength levels is reduced.

Capacity in a TDMA system is increased by compressing the transmission signal into a shorter time slot. As a result, the information must be transmitted at a correspondingly faster burst rate which increases the amount of occupied spectrum proportionally. The frequency bandwidths occupied are thus broader in FIG. 1(b) than in FIG. 1(a).

With FDMA or TDMA systems or hybrid FDMA/TDMA systems, the goal is to ensure that two potentially interfering signals do not occupy the same frequency at the same time. In contrast, Code Division Multiple Access (CDMA) allows signals to overlap in both time and frequency, as illustrated in FIG. 1(c). Thus, all CDMA signals share the same frequency spectrum. In either the frequency or the time domain, the multiple access signals overlap. In principle, the informational datastream to be transmitted is impressed upon a much higher bit rate datastream generated by a pseudorandom code generator. The informational datastream and the high bit rate datastream are multiplied together. This combination of higher bit rate signal with the lower bit rate datastream is called coding or spreading the informational datastream signal. Each informational datastream or channel is allocated a unique spreading code. A plurality of coded information signals are transmitted on radio frequency carrier waves and jointly received as a composite signal at a receiver. Each of the coded signals overlaps all of the other coded signals, as well as noise-related signals, in both frequency and time. By correlating the composite signal with one of the unique spreading codes, the corresponding information signal is isolated and decoded.

There are a number of advantages associated with CDMA communication techniques. The capacity limits of CDMA-based cellular systems are projected to be up to twenty times that of existing analog technology as a result of the properties of a wide band CDMA system, such as improved coding gain/modulation density, voice activity gating, sectorization and reuse of the same spectrum in every cell. CDMA is virtually immune to multi-path interference, and eliminates fading and static to enhance performance in urban areas. CDMA transmission of voice by a high bit rate decoder ensures superior, realistic voice quality. CDMA also provides for variable data rates allowing many different grades of voice quality to be offered. The scrambled signal format of CDMA completely eliminates cross talk and makes it very difficult and costly to eavesdrop or track calls, insuring greater privacy for callers and greater immunity from air time fraud. Various aspects of CDMA communications are described in K. Gilhousen et at., "On the Capacity of a Cellular CDMA System", *IEEE Trans. on Vehicular Technology* vol. 40, pp. 303–312 (May 1991).

In systems optimized for digital data transmission, M-ary digital modulation methods, in which one of M possible signals are transmitted during each signalling interval, are often used because of their improved efficiency. One method commonly used is Quadrature Phase Shift Keying (QPSK) in which two equal-magnitude signals in phase-quadrature are impressed on the carrier wave. Another common method is Offset QPSK (OQPSK) in which the maximum phase transition at any point in the modulated waveform is less than the maximum phase transition in a QPSK waveform. As a result, the composite OQPSK signal can have smaller envelope fluctuations after bandpass filtering, and thus more closely approach the constant envelope desired for such signalling. It will be appreciated that QPSK and OQPSK are forms of Quadrature Amplitude Modulation (QAM). Various aspects of these modulations are set forth in, for example, F. Stremler, *Introduction to Communication Systems*, 2d ed., pp. 590–596, Addison-Wesley Publishing Co., Reading, Massachusetts (1982); and S. Cronemeyer et at., "MSK and Offset QPSK Modulation", *IEEE Trans. on Communications* vol. COM-24, pp. 809–820 (Aug. 1976).

An example of a system optimized for digital data transmission is a CDMA system in which the demodulation of quadrature-modulated signals involves comparing the received wave with a theoretical wave modulated with hypothesized data patterns, e.g., a Viterbi demodulator. Another example of such a system is a CDMA system in which a stronger signal is demodulated first and then is subtracted from the received signal before a remaining weaker signal is demodulated, as described in commonly assigned U.S. Pat. No. 5,151,919 and allowed application Ser. No. 07/739,446 now U.S. Pat. No. 5,218,619. Both of these documents are expressly incorporated here by reference.

A typical quadrature modulator takes advantage of the quadrature phases of sine and cosine waves to modulate twice the information rate on the radio carrier wave. For example, the even bits in a digital information datastream can be modulated on the cosine wave, and the odd bits in the digital information datastream can be modulated on the sine wave. Errors can arise in quadrature modulators whenever the phases of the cosine and sine waves are not quite 90° apart, or whenever the amplitudes of the sine and cosine waves are not quite equal, or whenever there is residual carrier leakage when the modulating wave is supposedly zero, as well as for other reasons. Of course, the accuracy with which the quadrature modulation matches a synthesized, theoretical wave modulated with hypothesized data or with already received data is important in the above-described communication systems. The accuracy of quadrature modulators has been maintained conventionally by a combination of ensuring good matching between components and by making trimming adjustments to reduce residual mismatch errors.

A conventional quadrature modulator, shown in FIG. 2, includes an "in-phase" or I modulator 101, a "quadrature" or Q modulator 102, and a phase-splitting network 103 for supplying the double-sideband, suppressed carrier modulators 101,102 with cosine and sine carrier frequency signals, respectively. Ideally, the signals provided by the network 103 are $\cos(\omega t)$ and $\sin(\omega t)$, where $\omega$ is the carrier signal's angular frequency. Also shown in FIG. 2 are an I and Q modulation generator 104 for supplying I and Q modulation signals, a combination network 105 for adding the outputs of the I modulator 101 and the Q modulator 102, and trim potentiometers 106, 107 for carrier balance/d.c. offset adjustments for the I and Q signals, respectively. Additional trim potentiometers 108, 109 for amplitude matching the I and Q signals, respectively, are also shown in FIG. 2. The phase-splitting network 103 may also be adjustable, as indicated by the diagonal arrow, to achieve as nearly as possible the desired 90° phase difference between the sine and cosine carder frequency signals.

In practice, if the I modulator 101 and Q modulator 102 are constructed on the same silicon chip by integrated circuit technology, they will be very well matched, possibly eliminating the need for the amplitude adjustment potentiometers 108, 109. Also in some cases, the purposes of the phase-splitting network 103 can be achieved by starting with a signal having a frequency of $4\omega$, i.e., four times the desired carrier frequency $\omega$, and using the $4\omega$-signal to clock a digital logic divide-by-four circuit that produces the bit patterns:

0011001100110011...

and

0110011001100110..., which can be recognized as square waves of frequency $\frac{1}{4}$ the $4\omega$ bitrate having phases exactly $\frac{1}{4}$ of a period (90°) apart. It is usually acceptable to drive the I and Q modulators with square-wave carrier signals instead of with sinusoidal signals. Such a digital method of producing 90°-phased signals can be practical for frequencies ranging up to hundreds of megahertz, but at higher frequencies slight differences in speed of loading of the logic circuits can once more become a significant source of modulator error.

The carrier balance and/or d.c. offset adjustments try to ensure that, when the modulation generator 104 produces a zero signal level on its I and Q outputs, the corresponding output at the carrier frequency of the I and Q modulators is also zero. In essence, this requires the I modulator 101 to produce a zero cosine signal output for a zero I modulation and the Q modulator to produce a zero sine signal output for a zero Q modulation. It is well known that an I modulator imbalance can actually produce a sine signal when the cosine signal is zero, and a Q modulator imbalance can produce a cosine signal when the sine signal is zero. Accordingly, a small cosine leakage from the I modulator is sometimes desired to balance a cosine leakage from the Q modulator, and a small sine leakage from the Q modulator is sometimes desired to balance a sine leakage from the I modulator. With the two adjustment potentiometers 106, 107, however, carrier balance is more readily achievable.

Other sources of modulation inaccuracies are non-linearity in the modulators 101,102 and non-linearity in the modulation generator 104. The generator 104 often produces precursors of the I and Q modulation signals numerically by means of a digital signal processor, and then converts the precursors to analog modulating signals be means of digital-to-analog (D/A) converters. Mismatches between the I-signal D/A converter and the Q-signal D/A converter or in the anti-aliasing filters thereafter are a further source of modulation error. In some cases, the digital signal processor computes a pre-distortion of the modulating signal using an inverse of the non-linear transfer functions of the modulators 101,102 in order to compensate for modulator non-linearity. Techniques for simplifying the D/A conversion and subsequent anti-aliasing filtering by use of highly oversampled delta-modulation are also known, and lead to some reduction of the aforementioned modulation errors. One such technique is described in commonly assigned U.S. patent application No. 07/967,027 entitled "Multi-Mode Signal Processing", which is expressly incorporated here by reference.

U.S. Pat. No. 4,985,688 to Nagata discloses a modulation system in which an amplified, modulated output signal is fed back to a quadrature demodulator. The signal is demodulated and compared to a threshold value. A control signal is generated based on this comparison to adjust the system for nonlinearities of the amplifier that is connected to the modulator. When the threshold is exceeded, the normal modulation is apparently interrupted and replaced by a signal of 1/N-th the frequency or data rate. The Nagata patent also describes how to determine the instants at which the output of the quadrature demodulator should be sampled by use of a differentiator, divider circuit, and clock controlling means.

The Nagata patent's device may also be described as an adaptive, self-learning predistortion arrangement. The stated purpose of the Nagata patent is to inverse-predistort the input to a quadrature modulator such that the output after a distorting power amplifier is correct. On the other hand, the Nagata patent's device can hardly correct for errors in a quadrature modulator because it uses a quadrature demodulator to assess errors, and as described above the demodulator is likely to suffer from the same type of errors as the modulator. After all, if one could make a perfect demodulator, one would simply use it as a perfect modulator.

U.S. Pat. No. 4,581,749 to Carney et al. discloses a frequency modulation device usable in a mobile communication system. A feedback loop provides control of angle modulation error by comparing the modulated deviation amount with a predetermined deviation value. The automatic modulation error correction system described is for transmitters using pure angle modulation, specifically binary continuous-phase frequency shift keying (CPFSK).

In the system described in the Carney patent, an exact modulation index is generated by digitally switching the frequency between two exact values. Nevertheless, such a modulation is not used for transmission because the transitions are not filtered. The transmit waveform uses shaped one-zero transitions to contain the spectrum, and when a sufficient number of like bits occur in a row the frequency deviation of the shaped modulation should approach the same value as the unshaped modulation. Occurrences of such strings of like bits are detected and a comparison is made when they occur, the result being used in a feedback loop to adjust the modulation index. Thus, the Carney patent assesses errors only when the modulation is a long-enough string of ones or zeroes.

U.S. Pat. No. 5,020,076 to Cahill et at. describes switching between analog FM modulating a carrier signal source in the conventional way, and modulating it using a quadrature modulator. The quadrature modulator is left in the circuit when conventional FM is carried out, and the I and/or Q modulation signal is just set to a constant so that the quadrature modulator passes the FM signal straight through.

U.S. Pat. No. 4,856,025 to Takai describes a transmit diversity implementation for improving digital radio communication. A special waveform and special receiver are used, but the special receiver does not assess the accuracy of the transmitter modulation to provide information to a modulation correction system.

It will be appreciated from the foregoing that high modulation accuracy has heretofore been achieved by good design practices combined with specific, fixed, once-and-for-all adjustments that can compensate for fixed, immutable imperfections. It would be highly desirable to be able, continuously and interactively, to adjust and compensate for mutable modulation inaccuracies and errors as well.

SUMMARY

In accordance with the present invention, a transmitter receives its own transmission with an appropriate receiver and determines the transmission's modulation errors relative to the theoretical form the receiver expects. Adjustments are made interactively to the modulating waves in a direction that reduces the errors until convergence to the desired, theoretical form is achieved.

In one embodiment, a digital signal processor generates the I and Q modulation waveforms numerically, and makes numerical adjustments by adding offsets to achieve carrier balance, by multiplicative scaling to achieve I and Q matching, and by I and Q cross-coupling to compensate for 90°-phase-splitting errors. The numerical adjustments are continuously updated by a modulation assessment receiver operating on a sample of the transmitter output.

If a particular type of modulator (or demodulator) is susceptible to particular types of modulation inaccuracy, that modulator can be adapted to measure and report the features of the modulation necessary to continuously update the numerical adjustments, particularly when presented with a noise-free sample of the transmitted signal to evaluate. A modulation assessment receiver is provided for a system in which the modulation is a spread-spectrum signal using orthogonal or bi-orthogonal coding.

BRIEF DESCRIPTION OF THE DRAWINGS

The features and advantages of the invention will be understood by reading the following detailed description in conjunction with the drawings, in which:

FIG. 2 is a functional block diagram of a typical quadrature modulator;

FIGS. 5 and 6 illustrate how CDMA signals are decoded;

FIG. 7 illustrates a subtractive CDMA demodulation technique;

FIGS. 8(a), 8(b) are block diagrams of a transmitter and a receiver in a spread-spectrum communications system; and FIG. 9 shows waveforms of Shaped Offset Quadrature Amplitude Modulation (SOQAM).

DETAILED DESCRIPTION

Figure 1A:
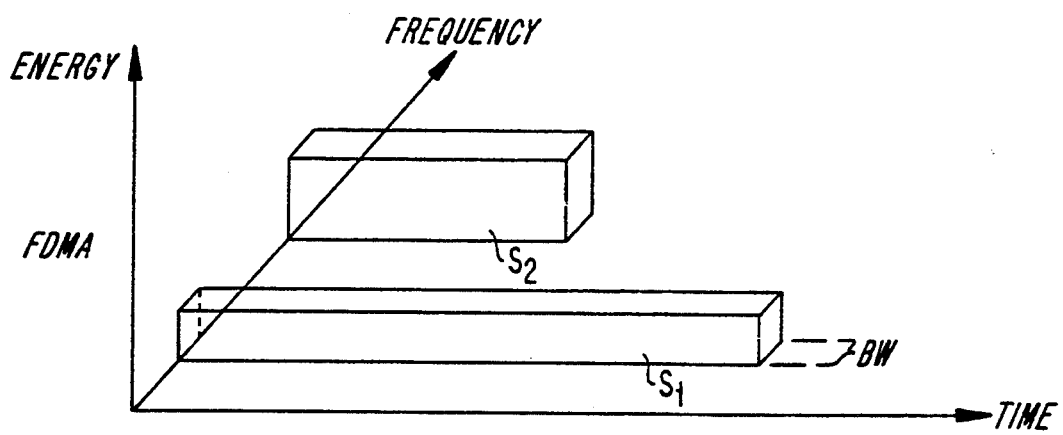
FIGS. 1(a)-(c) are plots of access channels using different multiple access techniques.
Figure 1B:
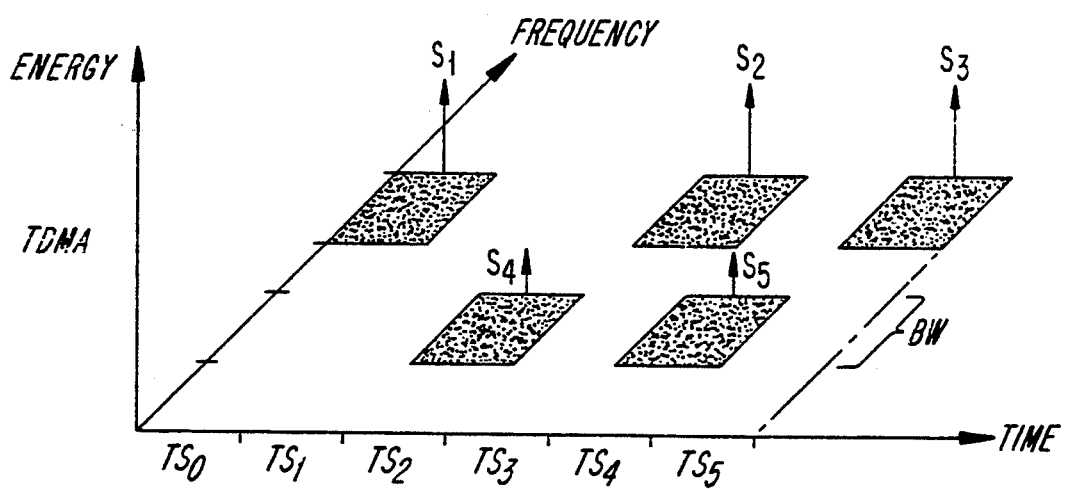
Figure 1C:
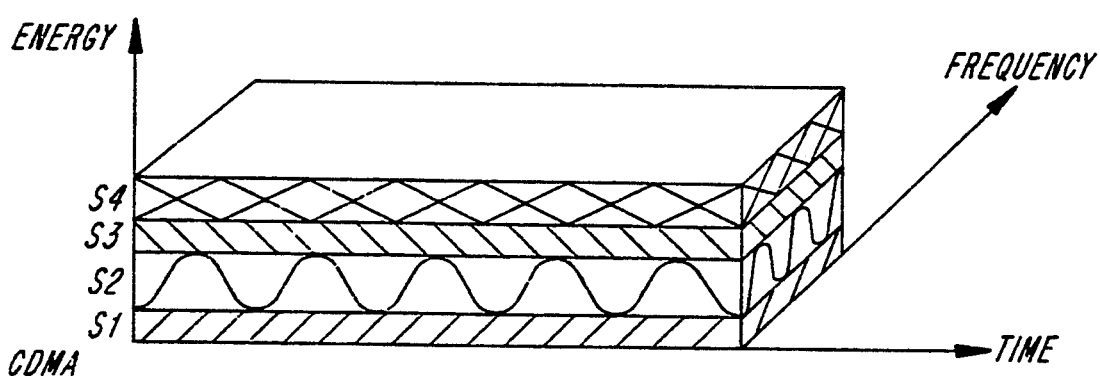

While the following description is in the context of cellular communications systems involving portable or mobile radio telephones and/or Personal Communication Networks (PCNs), it will be understood by those skilled in the art that the present invention may be applied to other communications applications. Moreover, while the present invention may be used in a subtractive CDMA demodulation system, it also may be used in applications of other types of spread-spectrum systems.

QUADRATURE MODULATOR IMPERFECTIONS

To assist in understanding the present invention, an analysis of the imperfections that can arise in quadrature modulators will first be given.

If the I and Q channels have a gain imbalance such that the gain of one channel is a factor A higher than the geometric mean, $(IQ)^{\frac{1}{2}}$, of the amplitude I of the unmodulated I-channel input and the amplitude Q of the unmodulated Q-channel input) and gain of the other channel is a factor A lower than $(IQ)^{\frac{1}{2}}$, and if, in addition, the cosine and sine carrier signals are not exactly 90° apart but a phase error $+\delta\Phi$ exists on the one carrier signal and a phase error $-\delta\Phi$ exists on the other carrier signal relative to some mean phase, then the cartesian form of the modulator output signal can be written as:

$$A I \cos(\omega t + \delta\Phi) + (Q/A) \sin(\omega t - \delta\Phi),$$

which expands to:

$$\cos(\omega t)[\cos(\delta\Phi)AI - (\sin(\delta\Phi)/A)Q] + \sin(\omega t)[(\cos(\delta\Phi)/A)Q - \sin(\delta\Phi)AI].$$

Defining $C = \cos(\delta\Phi)$ and $S = \sin(\delta\Phi)$, and using matrix notation, the modulator output signal becomes:

$$[\cos(\omega t) \sin(\omega t)] \begin{bmatrix} C & -S \\ -S & C \end{bmatrix} \begin{bmatrix} A & 0 \\ 0 & 1/A \end{bmatrix} \begin{bmatrix} I \\ Q \end{bmatrix}.$$

Since a desirable form is:

$$[\cos(\omega t) \sin(\omega t)] \begin{bmatrix} I_0 \\ Q_0 \end{bmatrix},$$

it can be seen that the following is required:

$$\begin{bmatrix} C & -S \\ -S & C \end{bmatrix} \begin{bmatrix} A & 0 \\ 0 & 1/A \end{bmatrix} \begin{bmatrix} I \\ Q \end{bmatrix} = \begin{bmatrix} I_0 \\ Q_0 \end{bmatrix},$$

which is satisfied when:

$$\begin{bmatrix} I \\ Q \end{bmatrix} = \frac{1}{C^2 - S^2} \begin{bmatrix} 1/A & 0 \\ 0 & A \end{bmatrix} \begin{bmatrix} C & S \\ S & C \end{bmatrix} \begin{bmatrix} I_0 \\ Q_0 \end{bmatrix}.$$

Since the common factor $1/(C^2 - S^2)$ is just an overall amplitude scaling, it can be dropped. Similarly, the right-hand side can be divided by $C = \cos(\delta\Phi)$, and $T = \tan(\delta\Phi) = S/C$ can be defined, with the following result:

$$\begin{bmatrix} I \\ Q \end{bmatrix} = \begin{bmatrix} 1/A & 0 \\ 0 & A \end{bmatrix} \begin{bmatrix} 1 & T \\ T & 1 \end{bmatrix} \begin{bmatrix} I_0 \\ Q_0 \end{bmatrix},$$

which can be written in non-matrix form as:

$$I = (I_0 + TQ_0)A$$

and $$Q = (Q_0 + TI_0)A.$$

The foregoing mathematical analysis demonstrates that the desired modulation may be obtained in spite of modulator imperfections by adding a fraction T of $Q_0$ to $I_0$ and then dividing by A and by adding a fraction T of $I_0$ to $Q_0$ and then multiplying by A.

One imperfection omitted from the foregoing analysis is a carrier imbalance, which can be taken into account simply by subtracting from I and Q the constants $K_i$ and $K_q$ equal to the amount of carrier imbalance to be corrected. The final formulae for the cartesian form of the I and Q are thus:

$$I = (I_0 + TQ_0)A - K_i$$

and $$Q = (Q_0 + TI_0)A - K_q.$$

In accordance with the present invention, the correction factors A, T, $K_i$, and $K_q$ are determined by sampling the modulator output waveform with a modulation assessment receiver and communicating the samples to a digital signal processor for generating the I and Q modulations and performing the precorrections given above.

Generally, the modulation assessment receiver must have a means for measuring the I and Q values actually generated by the transmitter's quadrature modulator and a means for comparing the measured I and Q values with ideal I and Q values in order to determine the correction factors. A conventional receiver, however, normally resolves a radio signal into I and Q components using the same type of quadrature modulator circuit that the transmitter uses but operating in reverse. As described above, it is impossible, in principle, to distinguish errors in the modulator from errors in the demodulator in this case.

To avoid this error indistinguishability, a modulation assessment receiver in accordance with one aspect of the present invention uses log-polar signal processing to measure the transmitter signal's phase and the logarithm of its amplitude, instead of the cartesian I and Q components. After digitization, the receiver numerically converts the measurements from the log-polar form to the desired cartesian form. Log-polar signal processing is described in U.S. Pat. No. 5,048,059, which is expressly incorporated here by reference.

A simple procedure for estimating the correction factors, given a set of desired I and Q values, $I_j$ and $Q_j$, for $j = 1, \ldots, N$, and a set of corresponding measured I and Q values, $I'_j$ and $Q'_j$, is as follows, where it is postulated that:

$$I'_j = BI_j - BTQ_j + K_i \qquad (1)$$

and $$Q'_j = CQ_j - CTI_j + K_q, \qquad (2)$$

and it is desired to find B, C, $T = \tan(\delta\Phi)$, $K_i$, and $K_q$ that satisfy Eqs. (1) and (2).

First, the desired $I_j$ and $Q_j$ are divided into two subsets, the first subset $\{I_j^{posI}, Q_j^{posI}\}$ containing only the positive values of $I_j$, and the second subset $\{I_j^{negI}, Q_j^{negI}\}$ containing only the negative values of $I_j$. If one subset contains more values than the other subset, only $N_1$ values (where $N_1$ is equal to the number of values in the smaller subset) are used in both subsets.

The sum over $N_1$ values of $I_j$ in the positive subset $\{I_j^{posI}, Q_j^{posI}\}$ is defined to be $I_{S1}$:

$$I_{S1} = \sum_{j=1}^{N_1} I_j^{posI},$$

and the sum over $N_1$ values of $Q_j$ in the positive subset $\{I_j^{posI}, Q_j^{posI}\}$ is defined to be $Q_{S1}$:

$$Q_{S1} = \sum_{j=1}^{N_1} Q_j^{posI}.$$

The sum over $N_1$ values of $I'_j$ in the subset , $\{I'_j{}^{posI}, Q'_j{}^{posI}\}$ corresponding to the positive subset $\{I_j{}^{posI}, Q_j{}^{posI}\}$ is defined to be $I'_{S1}$:

$$I'_{S1} = \sum_{j=1}^{N_1} I'_j{}^{posI},$$

and the sum over $N_1$ values of $Q'_j$ in the subset , $\{I'_j{}^{posI}, Q'_j{}^{posI}\}$ corresponding to the positive subset $\{I_j{}^{posI}, Q_j{}^{posI}\}$ is defined to be $Q'_{S1}$:

$$Q'_{S1} = \sum_{j=1}^{N_1} Q'_j{}^{posI}.$$

Because all of the I values summed to get $I_{S1}$ were chosen to be positive and the signs of the corresponding Q values summed to get $Q_{S1}$ were uncorrelated, $I_{S1}$ will in general be much larger than $Q_{S1}$.

The sum over $N_1$ values of $I_j$ in the negative subset $\{I_j{}^{negI}, Q_j{}^{negI}\}$ is defined to be $I_{S2}$:

$$I_{S2} = \sum_{j=1}^{N_1} I_j{}^{negI}$$

and the sum over $N_1$ values of $Q_j$ in the negative subset $\{I_j{}^{negI}, Q_j{}^{negI}\}$ is defined to be $Q_{S2}$:

$$Q_{S2} = \sum_{j=1}^{N_1} Q_j{}^{negI}.$$

In a similar way, the sum over $N_1$ values of $I'_j$ in the subset $\{I'_j{}^{negI}, Q'_j{}^{negI}\}$ corresponding to the negative subset $\{I_j{}^{negI}, Q_j{}^{negI}\}$ is defined to be $I'_{S2}$:

$$I'_{S2} = \sum_{j=1}^{N_1} I'_j{}^{negI}$$

and the sum over $N_1$ values of $Q'_j$ in the subset $\{I'_j{}^{negI}, Q'_j{}^{negI}\}$ corresponding to the negative subset, $\{I_j{}^{negI}, Q_j{}^{negI}\}$ is defined to be $Q'_{S2}$:

$$Q'_{S2} = \sum_{j=1}^{N_1} Q'_j{}^{negI}.$$

Because all of the I values summed to get $I_{S2}$ were chosen to be negative and the signs of the corresponding Q values summed to get $Q_{S2}$ were uncorrelated, the magnitude of $I_{S2}$ will in general be much larger than the magnitude of $Q_{S2}$.

The sum over $N_1$ values of $I'_j$ in the subset $\{I'_j{}^{posI}, Q'_j{}^{posI}\}$ corresponding to the positive subset $\{I_j{}^{posI}, Q_j{}^{posI}\}$ is, from Eq. (1) above:

$$I'_{S1} = BI_{S1} - BTQ_{S1} + N_1 K_i \tag{3},$$

and the sum over $N_1$ values of $I'_j$ in the subset $\{I'_j{}^{negI}, Q'_j{}^{negI}\}$ corresponding to the negative subset, $\{I_j{}^{negI}, Q_j{}^{negI}\}$ is, also from Eq. (1):

$$I'_{S2} = BI_{S2} - BTQ_{S2} + N_1 K_i \tag{4}.$$

Subtracting Eq. (4) from Eq. (3), $K_i$ is eliminated, giving:

$$B = \frac{(I'_{S1} - I'_{S2}) + BT(Q_{S1} - Q_{S2})}{(I_{S1} - I_{S2})} =$$

$$\frac{(I'_{S1} - I'_{S2})}{(I_{S1} - I_{S2})} \left[ 1 - \frac{T(Q_{S1} - Q_{S2})}{(I_{S1} - I_{S2})} \right]^{-1}.$$

Because T is small and $(Q_{S1} - Q_{S2})$ is much smaller than $(I_{S1} - I_{S2})$, an adequate solution for B is obtained by substituting the old (or the initial) value of T in the right hand side of the above expression for B.

Next, the desired $I_j$ and $Q_j$ are divided into two subsets, the first subset $\{I_j{}^{posQ}, Q_j{}^{posQ}\}$ containing only the positive values of $Q_j$, and the second subset $\{I_j{}^{negQ}, Q_j{}^{negQ}\}$ containing only the negative values of $Q_j$. If one subset contains more values than the other subset, only $N_2$ values (where $N_2$ is equal to the number of values in the smaller subset) are used in both subsets.

The sum over $N_2$ values of $I_j$ in the positive subset $\{I_j{}^{posQ}, Q_j{}^{posQ}\}$ is defined to be $I_{S3}$:

$$I_{S3} = \sum_{j=1}^{N_2} I_j{}^{posQ}$$

and the sum over $N_2$ values of $Q_j$ in the positive subset $\{I_j{}^{posQ}, Q_j{}^{posQ}\}$ is defined to be $Q_{S3}$:

$$Q_{S3} = \sum_{j=1}^{N_2} Q_j{}^{posQ}.$$

The sum over $N_2$ values of $I'_j$ in the subset $\{I'_j{}^{posQ}, Q'_j{}^{posQ}\}$ corresponding to the positive subset $\{I_j{}^{posQ}, Q_j{}^{posQ}\}$ is defined to be $I'_{S3}$:

$$I'_{S3} = \sum_{j=1}^{N_2} I'_j{}^{posQ}$$

and the sum over $N_2$ values of $Q'_j$ in the subset $\{I'_j{}^{posQ}, Q'_j{}^{posQ}\}$ corresponding to the positive subset $\{I_j{}^{posQ}, Q_j{}^{posQ}\}$ is defined to be $Q'_{S3}$:

$$Q'_{S3} = \sum_{j=1}^{N_2} Q'_j{}^{posQ}.$$

Because all of the Q values summed to get $Q_{S3}$ were chosen to be positive and the signs of the corresponding I values summed to get $I_{S3}$ were uncorrelated, $Q_{S3}$ will in general be much larger than $I_{S3}$.

The sum over $N_2$ values of $I_j$ in the negative subset $\{I_j{}^{negQ}, Q_j{}^{negQ}\}$ is defined to be $I_{S4}$:

$$I_{S4} = \sum_{j=1}^{N_2} I_j{}^{negQ}$$

and the sum over $N_2$ values of $Q_j$ in the negative subset $\{I_j{}^{negQ}, Q_j{}^{negQ}\}$ is defined to be $Q_{S4}$:

$$Q_{S4} = \sum_{j=1}^{N_2} Q_j{}^{negQ}.$$

In a similar way, the sum over $N_2$ values of $I'_j$ in the subset $\{I'_j{}^{negQ}, Q'_j{}^{negQ}\}$ corresponding to the negative subset $\{I_j{}^{negQ}, Q_j{}^{negQ}\}$ is defined to be $I'_{S4}$:

$$I'_{S4} = \sum_{j=1}^{N_2} I'^{negQ}_j$$

and the sum over $N_2$ values of $Q'_j$ in the subset $\{I'^{negQ}_j, Q'^{negQ}_j\}$ corresponding to the negative subset $\{I^{negQ}_j, Q^{negQ}_j\}$ is defined to be $Q'_{S4}$:

$$Q'_{S4} = \sum_{j=1}^{N_2} Q'^{negQ}_j.$$

Because all of the Q values summed to get $Q_{S4}$ were chosen to be negative and the signs of the corresponding I values summed to get $I_{S4}$ were uncorrelated, the magnitude of $Q_{S4}$ will in general be much larger than the magnitude of $I_{S4}$.

The sum over $N_2$ values of $Q'_j$ in the subset $\{I'^{posQ}_j, Q'^{posQ}_j\}$ corresponding to the positive subset $\{I^{posQ}_j, Q^{posQ}_j\}$ is, from Eq. (2):

$$Q'_{S3} = CQ_{S3} - CTI_{S3} + N_2 K_q \quad (5),$$

and the sum over $N_2$ values of $Q'_j$ in the subset $\{I'^{negQ}_j, Q'^{negQ}_j\}$ corresponding to the negative subset $\{I^{negQ}_j, Q^{negQ}_j\}$ is, also from Eq. (2):

$$Q'_{S4} = CQ_{S4} - CTI_{S4} + N_2 K_q \quad (6).$$

Subtracting Eq. (6) from Eq. (5), $K_q$ is eliminated, giving:

$$C = \frac{(Q'_{S3} - Q'_{S4}) + CT(I_{S3} - I_{S4})}{(Q_{S3} - Q_{S4})} =$$

$$\frac{(Q'_{S3} - Q'_{S4})}{(Q_{S3} - Q_{S4})} \left[ 1 - \frac{T(I_{S3} - I_{S4})}{(Q_{S3} - Q_{S4})} \right]^{-1}.$$

Because T is small and $(I_{S3} - I_{S4})$ is much smaller than $(Q_{S3} - Q_{S4})$, an adequate solution for C is obtained by substituting the old (or the initial) value of T in the right hand side of the above expression for C.

Similarly, the sum over $N_1$ values of $Q'_j$ in the subset $\{I'^{posI}_j, Q'^{posI}_j\}$ corresponding to the positive subset $\{I^{posI}_j, Q^{posI}_j\}$ is, from Eq. (2):

$$Q'_{S1} = CQ_{S1} - CTI_{S1} + N_1 K_q \quad (7),$$

and the sum over $N_1$ values of $Q'_j$ in the subset $\{I'^{negI}_j, Q'^{negI}_j\}$ corresponding to the negative subset $\{I^{negI}_j, Q^{negI}_j\}$ is, also from Eq. (2):

$$Q'_{S2} = CQ_{S2} - CTI_{S2} + N_1 K_q \quad (8).$$

Subtracting Eq. (8) from Eq. (7), $K_q$ is eliminated, giving:

$$T = \frac{(Q'_{S2} - Q'_{S1}) + C(Q_{S1} - Q_{S2})}{C(I_{S1} - I_{S2})}.$$

Furthermore, the sum over $N_2$ values of $I'_j$ in the subset $\{I'^{posQ}_j, Q'^{posQ}_j\}$ corresponding to the positive subset $\{I^{posQ}_j, Q^{posQ}_j\}$ is, from Eq. (1):

$$I'_{S3} = BI_{S3} - BTQ_{S3} + N_2 K_i \quad (9),$$

and the sum over $N_2$ values of $I'_j$ in the subset $\{I'^{negQ}_j, Q'^{negQ}_j\}$ corresponding to the negative subset $\{I^{negQ}_j, Q^{negQ}_j\}$ is, also from Eq. (1):

$$I'_{S4} = BI_{S4} - BTQ_{S4} + N_2 K_i \quad (10).$$

Subtracting Eq. (10) from Eq. (9), $K_i$ is eliminated, giving:

$$T = \frac{(I'_{S4} - I'_{S3}) + B(I_{S3} - I_{S4})}{B(Q_{S3} - Q_{S4})}.$$

Using the updated solutions for B and C above in the expressions for T, an updated solution for T is obtained. Finally, substituting the new values $A^{new}$, $B^{new}$, and $T^{new}$ in Eqs. (1) and (2), and summing over all N values of $I_j$, $Q_j$, $I'_j$, and $Q'_j$, new solutions are obtained for $K_i$:

$$K_i^{new} = \frac{1}{N} \sum_{j=1}^{N} [I'_j + B^{new}(T^{new}Q_j - I_j)],$$

and for $K_q$:

$$K_q^{new} = \frac{1}{N} \sum_{j=1}^{N} [Q'_j + C^{new}(T^{new}I_j - Q_j)].$$

SELF-ADJUSTING QUADRATURE MODULATORS

Figure 3:
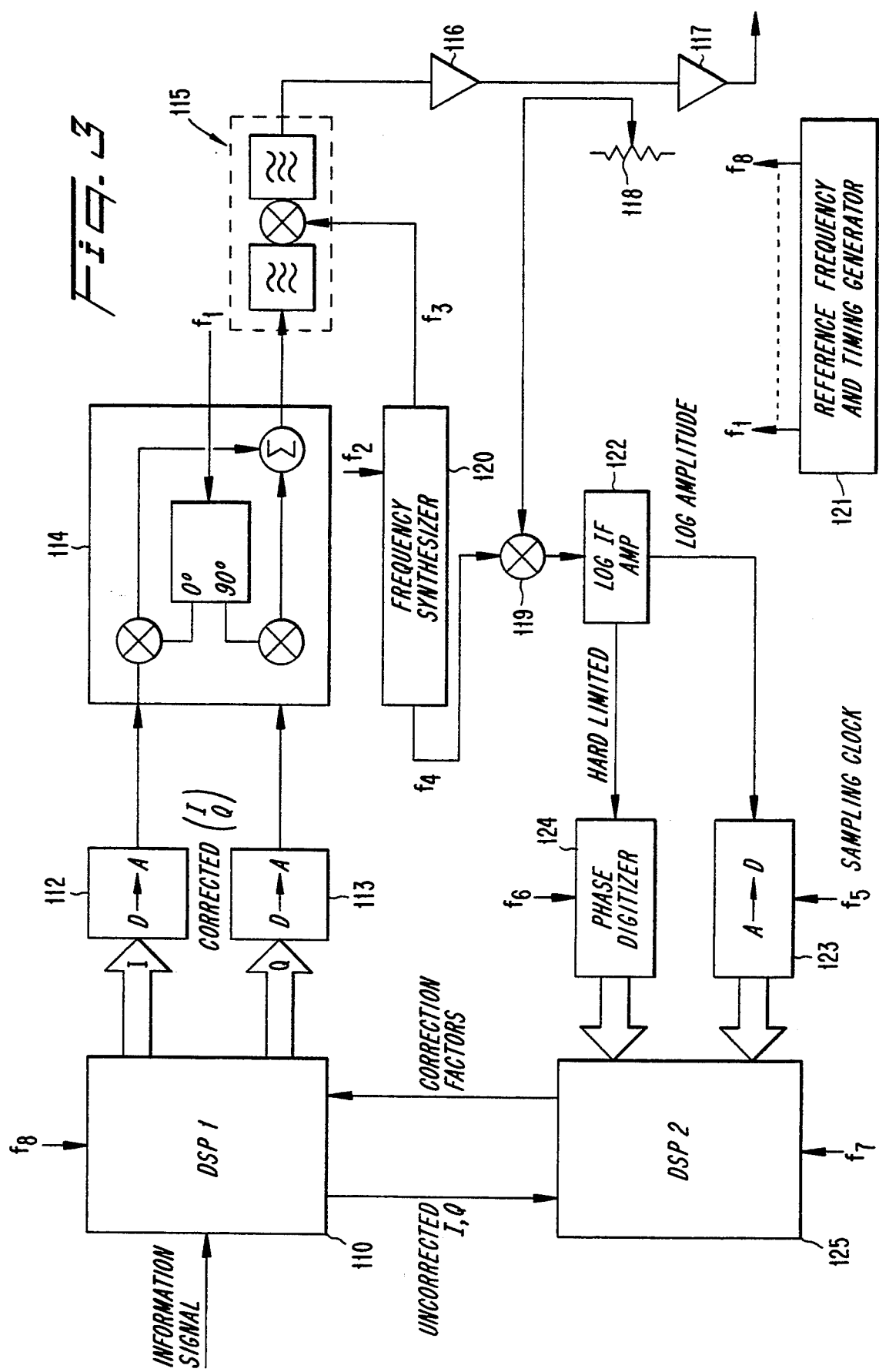
FIG. 3 is a functional block diagram of a system in accordance with the present invention.

A self-adjusting quadrature modulator implementing the above-described procedure is shown in FIG. 3. A first digital signal processor 110 receives an information signal to be transmitted and converts the information to I and Q waveforms according to the intended modulation technique. The I and Q waveforms are converted from the numerical values produced by the digital signal processor 110 to analog waveforms using digital-to-analog (D/A) converters 112, 113 (for the I and Q waveforms, respectively) as required by a quadrature modulator 114. Aspects of quadrature modulators and the advantages of high-bit-rate delta-sigma modulation are described in U.S. patent application No. 07/967,027 incorporated by reference above. High-bit-rate delta-sigma-modulation bitstreams are easily converted to the analog voltage they represent by forming the moving average voltage over a large number of bits. This can be done by a continuous-time, low-pass filter having a bandwidth that is a small fraction of the bit rate but that is still sufficient to pass all desired modulation components. For a balanced signal configuration, balanced filters would be used.

Quadrature modulator integrated circuits are commercially available, for example, from Hewlett-Packard Co. (part no. MX2001), and from Siemens (part no. PMB2200). These circuits have balanced I and Q inputs. If, instead of using high-bit-rate delta-sigma modulation to convert numerical I, Q values to analog waveforms, a conventional D/A converter such as an 8- or 12-bit device were employed, then either four matched devices would be needed to drive the $\pm I$ and $\pm Q$ inputs of the modulator, or a pair of devices having balanced outputs. However, use of the delta-sigma technique can be integrated as a small part of a larger digital integrated circuit, and can avoid the complications associated with the use of conventional D/A converters.

An upconverter 115, comprising a mixer and suitable bandpass filters, translates the output of the quadrature modulator 114 from an intermediate frequency, at which the quadrature modulator 114 most conveniently operates, to the frequency of transmission. Power amplifiers 116, 117 raise the power level to the desired transmission value. A coupler 118 extracts a sample of the modulated transmission signal from any convenient point in the post-modulation transmission chain. In FIG. 3, since the sample is extracted at the final frequency just before the final transmission power amplifier 117, the sample is translated down to a suitable frequency for comparison with the intended modulation by a downconverter 119. A local oscillator frequency synthesizer 120 may conveniently be used to drive both the upconverter 115 and the downconverter 119. Alternatively, downconversion can be effected by the downconverter 119 and a different local oscillator frequency synthesizer provided the different synthesizer synthesizes its frequency using the output of a reference frequency standard 121 from which all other frequencies $f_1$ through $f_8$ that are used as shown are derived. It will be understood that sampling the signal late in the post-modulation transmission chain permits correction of errors arising in post-modulator components.

The downconverted signal sample extracted from the post-modulated transmission signal by the coupler 118 is subjected to a log-polar digitization utilizing an intermediate frequency amplifier 122, which produces an output signal approximately proportional to the natural logarithm of the instantaneous amplitude of the signal sample as well as a hardlimited signal that preserves the instantaneous signal phase information. The logamplitude signal is digitized by a suitable analog-to-digital (A/D) converter 123 and the hardlimited, phase-preserving signal is digitized by a suitable phase digitizer 124. The phase digitizer 124 can advantageously be constructed as described in U.S. Pat. No. 5,148,373 which is expressly incorporated here by reference.

The A/D converter 123 may be of the successive approximation type with an accuracy of eight bits. Alternatively, the converter 123 could first employ high-bit-rate delta-sigma modulation to digitize the signal, followed by a decimation filter to downsample the high-bit-rate delta-sigma bitstream to a lower-rate stream of binary numbers. High bit-rate delta modulation or alternatively companded delta modulation could also be used, having an implicit differentiation (i.e., it measures rate of change of the log-amplitude signal) that has to be undone by re-integrating numerically afterwards. The latter technique has the advantage that small amplitude changes can more easily be resolved, a factor which could be important for modulations that have or should have little amplitude modulation component.

The log-polar digitized signal samples output from the A/D converter 123 and the phase digitizer 124 are fed to a second digital signal processor 125 that also receives from the first digital signal processor 110 the desired (uncorrected) I and Q modulations. The second digital signal processor 125 performs phase alignment of the signal samples by modulo-$2\pi$ adding a numerical phase offset value to the phase samples before log-polar-to-cartesian conversion. The second digital signal processor 125 then compares the phase-aligned, log-polar-to-cartesian-converted signal samples with the desired I and Q modulation values using a suitable process such as that described above to determine correction factors that are fed back to the first digital signal processor 110.

The first processor 110 uses the correction factors to generate corrected, self-adjusted I and Q waveforms for modulation and transmission. The phase alignment constant ($\pm\delta\Phi$) may also be updated by techniques similar to those already described above, and successive cycles will yield successive corrections. Of course, the functions of the processors 110, 125 could be carried out by a suitably capable signal processor. A suitable digital signal processing chip is, for example, the model no. TMS320C50, made by Texas Instruments, which can operate at instruction speeds of at least 20 MIPS.

It will be appreciated that the non-ideal features and imperfections of I and Q modulators are substantially constant for substantial periods of time, or change very slowly, for example, due to temperature changes, and thus the correction factors do not need to be continuously updated. On the other hand, the correction factors can be updated almost continuously if conditions require it, and even occasional updating of the correction factors will result in a system that is far more responsive, interactive, and accurate than previously known once-and-for-all, fixed compensating modulator adjustments. The present invention is particularly advantageous when used with a subtractive CDMA system using orthogonal coding, as described in the U.S. patent and patent application incorporated by reference above. CDMA demodulation techniques will now be described in conjunction with the signal graphs shown in FIGS. 4–6, which set forth example waveforms in the coding and decoding processes involved in traditional CDMA systems. Using the waveform examples from FIGS. 4–6, the improved performance of a subtractive CDMA demodulation technique is illustrated in FIG. 7.

Figure 4:
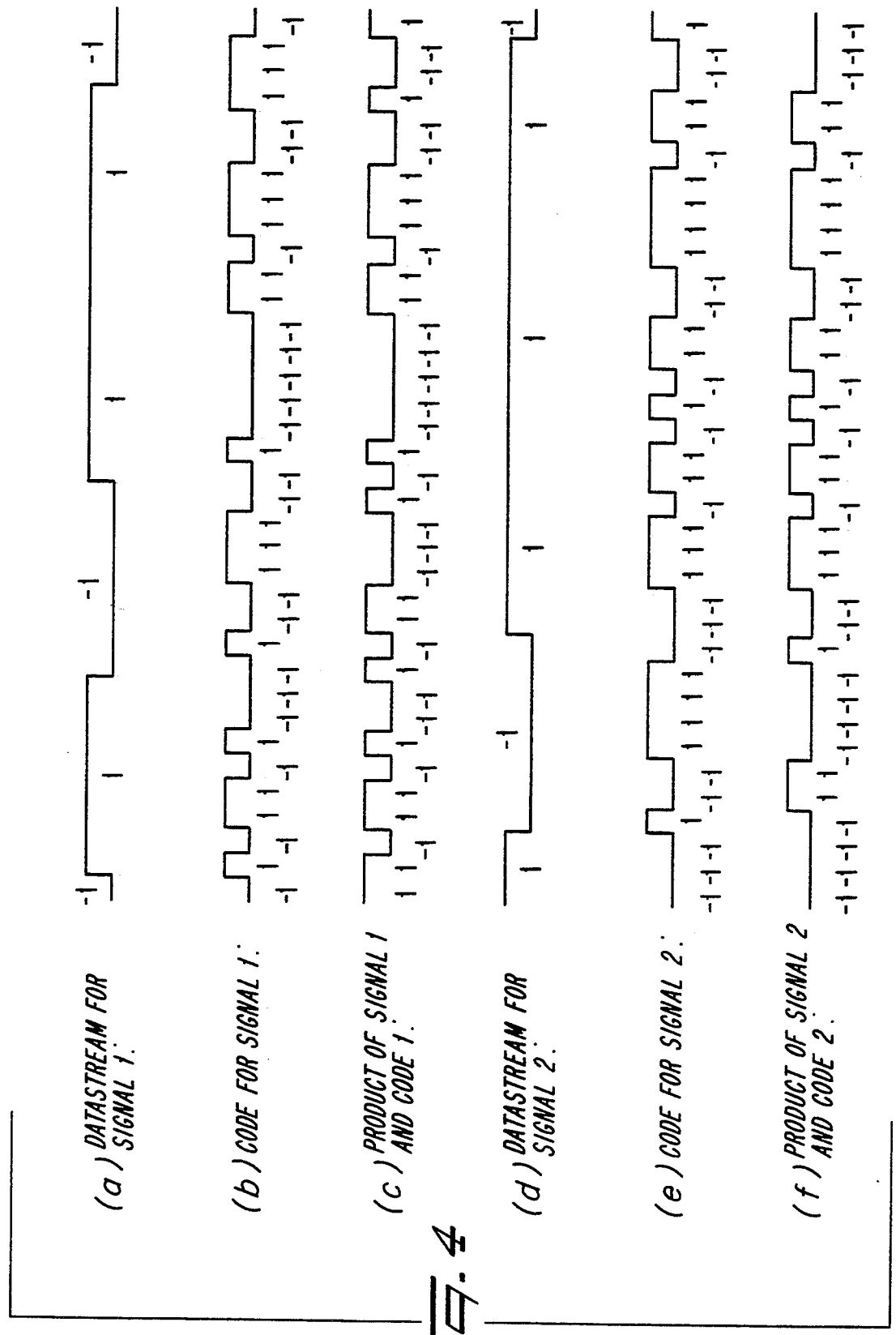
FIG. 4 illustrates how CDMA signals are generated.

Two different datastreams, shown in FIG. 4 as signal graphs (a) and (d), represent digitized information to be communicated over two separate communication channels. Information signal 1 is modulated using a high bit rate, digital code that is unique to signal 1 and that is shown in signal graph (b). For purposes of this description, the term "bit" refers to a binary digit or symbol of the information signal. The term "bit period" refers to the time period between the start and the finish of one bit of the information signal. The term "chip" refers to a binary digit of the high rate code signal. Accordingly, the term "chip period" refers to the time period between the start and the finish of one chip of the code signal. Naturally, the bit period is much greater than the chip period. The result of this modulation, which is essentially the product of the two signal waveforms, is shown in the signal graph (c). In Boolean notation, the modulation of two binary waveforms is essentially an exclusive-OR operation. A similar series of operations is carried out for information signal 2 as shown in signal graphs (d)–(f). In practice, of course, many more than two coded information signals are spread across the frequency spectrum available for cellular telephone communications.

Each coded signal is used to modulate an RF carrier using any one of a number of modulation techniques, such as QPSK. In a cellular telephone system, each modulated carrier is transmitted over an air interface. At a radio receiver, such as a cellular base station, all of the signals that overlap in the allocated frequency bandwidth are received together. The individually coded signals are added, as represented in the signal graphs (a)–(c) of FIG. 5, to form a composite signal waveform (graph (c)).

After demodulation of the received signal to the appropriate baseband frequency, the decoding of the composite signal takes place. Information signal 1 may be decoded or despread by multiplying the received composite signal shown in FIG. 5(c) with the unique code used originally to modulate signal 1 that is shown in signal graph (d). The resulting signal is analyzed to decide the polarity (high or low, +1 or −1, "1" or "0") of each information bit period of the signal. The details of how the receiver's code generator becomes time synchronized to the transmitted code are known in the art.

These decisions may be made by taking an average or majority vote of the chip polarities during each bit period. Such "hard" decision making processes are acceptable as long as there is no signal ambiguity. For example, during the first bit period in the signal graph (f), the average chip value is +1.00 which readily indicates a bit polarity +1. Similarly, during the third bit period, the average chip value is +0.75, and the bit polarity is also most likely a +1. However, in the second bit period, the average chip value is zero, and the majority vote or average test fails to provide an acceptable polarity value.

In such ambiguous situations, a "soft" decision making process must be used to determine the bit polarity. For example, an analog voltage proportional to the received signal after despreading may be integrated over the number of chip periods corresponding to a single information bit. The sign or polarity of the net integration result indicates that the bit value is a +1 or −1.

The decoding of signal 2, similar to that of signal 1, is illustrated in the signal graphs (a)-(d) of FIG. 6. However, after decoding, there are no ambiguous bit polarity situations.

Theoretically, this decoding scheme can be used to decode every signal that makes up the composite signal. Ideally, the contribution of unwanted interfering signals is minimized when the digital spreading codes are orthogonal to the unwanted signals. (Two binary sequences are orthogonal if they differ in exactly one half of their bit positions.) Unfortunately, only a certain number of orthogonal codes exist for a given word length. Another problem is that orthogonality can be maintained only when the relative time alignment between two signals is strictly maintained. In communications environments where portable radio units are moving constantly, such as in cellular systems, precise time alignment is difficult to achieve. When code orthogonality cannot be guaranteed, noise-based signals may interfere with the actual bit sequences produced by different code generators, e.g., the mobile telephones. In comparison with the originally coded signal energies, however, the energy of the noise signals is usually small.

"Processing gain" is a parameter of spread spectrum systems, and for a direct spreading system it is defined as the ratio of the spreading or coding bit rate to the underlying information bit rate, i.e., the number of chips per information bit or symbol. Thus, the processing gain is essentially the bandwidth spreading ratio, i.e., the ratio of the bandwidths of the spreading code and information signal. The higher the code bit rate, the wider the information is spread and the greater the spreading ratio. For example, a one kilobit per second information rate used to modulate a one megabit per second code signal has processing gain of 1000:1. The processing gain shown in FIG. 4, for example, is 8:1, the ratio of the code chip rate to the information datastream bit rate.

Large processing gains reduce the chance of decoding noise signals modulated using uncorrelated codes. For example, processing gain is used in military contexts to measure the suppression of hostile jamming signals. In other environments, such as cellular systems, processing gain helps suppress other, friendly signals that are present on the same communications channel but use codes that are uncorrelated with the desired code. In the context of the subtractive CDMA demodulation technique, "noise" includes both hostile and friendly signals, and may be defined as any signals other than the signal of interest, i.e., the signal to be decoded. Expanding the example described above, if a signal-to-interference ratio of 10:1 is required and the processing gain is 1000:1, conventional CDMA systems have the capacity to allow up to 101 signals of equal energy to share the same channel. During decoding, 100 of the 101 signals are suppressed to 1/1000th of their original interfering power. The total interference energy is thus 100/1000, or 1/10, as compared to the desired information energy of unity. With the information signal energy ten times greater than the interference energy, the information signal may be correlated accurately.

Together with the required signal-to-interference ratio, the processing gain determines the number of allowed overlapping signals in the same channel. That this is still the conventional view of the capacity limits of CDMA systems may be recognized by reading, for example, the above-cited paper by Gilhousen et al.

In contrast to conventional CDMA, an important aspect of the subtractive CDMA demodulation technique is the recognition that the suppression of friendly CDMA signals is not limited by the processing gain of the spread spectrum demodulator as is the case with the suppression of military type jamming signals. A large percentage of the other signals included in a received, composite signal are not unknown jamming signals or environmental noise that cannot be correlated. Instead, most of the noise, as defined above, is known and is used to facilitate decoding the signal of interest. The fact that the characteristics of most of these noise signals are known, including their corresponding spreading codes, is used in the subtractive CDMA demodulation technique to improve system capacity and the accuracy of the signal decoding process. Rather than simply decode each information signal from the composite signal, the subtractive CDMA demodulation technique also removes each information signal from the composite signal after it has been decoded. Those signals that remain are decoded only from the residual of the composite signal. Consequently, the already decoded signals do not interfere with the decoding of the remaining signals.

For example, in FIG. 7, if signal 2 has already been decoded as shown in the signal graph (a), the coded form of signal 2 can be reconstructed as shown in the signal graphs (b) and (c) (with the start of the first bit period of the reconstructed datastream for signal 2 aligned with the start of the fourth chip of the code for signal 2 as shown in FIG. 4 signal graphs (d) and (e)), and subtracted from the composite signal in the signal graph (d) (again with the first chip of the reconstructed coded signal 2 aligned with the fourth chip of the received composite: signal) to leave coded signal 1 in the signal graph (e). This is easily verified by comparing signal graph (e) in FIG. 7 with signal graph (c) in FIG. 4 (truncated by removing the first three and the very last chip). Signal 1 is recaptured easily by multiplying the coded signal 1 with code 1 to reconstruct signal 1. Note that because the bit periods of datastreams for signals 1 and 2 are shifted relative to one another by 2 chips there are only six +1 chips in the first bit period of the recaptured signal 1 shown in FIG. 7 signal graph (f). It is significant that while the conventional CDMA decoding method was unable to determine whether the polarity of the information bit in the second bit period of signal 1 was a +1 or a −1 in signal graph (f) of FIG. 5, the decoding method of the subtractive CDMA demodulation technique effectively resolves that ambiguity simply by removing signal 2 from the composite signal.

A general CDMA system will now be described in conjunction with FIGS. 8(a), 8(b). In the transmitter shown in FIG. 8(a), an information source such as speech is converted from analog format to digital format in a conventional source coder 20. The digital bitstream generated by the transmitter source coder 20 may be further processed in a transmitter error correction coder 22 that adds redundancy which increases the bandwidth or bit rate of the transmission. In response to a spreading code selection signal from a suitable control mechanism such as a programmable microprocessor (not shown), a particular spreading code is generated by a transmit spreading code generator 24, which may be a pseudorandom number generator. The selected spreading code is summed in a modulo-2 adder 26 with the coded information signal from the error correction coder 22. It will be appreciated that the modulo-2 addition of two binary sequences is essentially an exclusive-OR operation in binary logic. The modulo-2 summation effectively "spreads" each bit of information from the coder 22 into a plurality of "chips".

The coded signal output by the adder 26 is used to modulate an RF carrier using a modulation technique such as QPSK in a modulator 28. The modulated carrier is transmitted over an air interface by way of a conventional radio transmitter 30. A plurality of the coded signals overlapping in the allocated frequency band are received together in the form of a composite signal waveform at a radio receiver 32, such as a cellular radiotelephone base station, illustrated in FIG. 8(b). After demodulation in a demodulator 34 to baseband, the composite signal is decoded.

An individual information signal is decoded or "despread" by multiplying the composite signal with the corresponding unique spreading code produced by a receiver spreading code generator 36. This unique code corresponds to that spreading code used originally to spread that information signal in the transmit spreading code generator 24. The spreading code and the demodulated signal are combined by a multiplier 38. Because several received chips represent a single bit of transmitted information, the output signal of multiplier 38 may be successively integrated over a particular number of chips in order to obtain the actual values of the information bits. As described above, these bit value decisions may be made by taking an average or majority vote of the chip polarities during each bit period. In any event, the output signals of multiplier 38 are eventually applied to a receiver error correction decoder 40 that reverses the process applied by the transmitter error correction coder 22, and the resulting digital information is converted into analog format (e.g., speech) by a source decoder 42.

As described above, this decoding scheme theoretically can be used to decode every signal in the composite signal. Ideally, the contribution of unwanted, interfering signals is minimized when the digital spreading codes are orthogonal to these unwanted signals and when the relative timing between the signals is strictly maintained. Unfortunately, only a certain number of orthogonal codes exist for a finite word length, and in communications environments where portable radio units are moving constantly, such as in cellular systems, time alignment is difficult to achieve.

In a preferred CDMA communication system, the error correction coding is based on orthogonal or bi-orthogonal block coding of the information to be transmitted. In orthogonal block coding, a number of bits M to be transmitted are converted to one of $2^M$ $2^M$-bit orthogonal codewords. Decoding an orthogonal codeword involves correlation with all members of the set of $N=2^M$ codewords. The binary index of the codeword giving the highest correlation yields the desired information. For example, if a correlation of sixteen 16-bit codewords numbered 0-15 produces the highest correlation on the tenth 16-bit codeword, the underlying information signal is the 4-bit binary codeword 1010 (which is the integer 10 in decimal notation, hence, the index of 10). Such a code is also termed a [16,4] orthogonal block code and has a spreading ratio R=16/4=4. By inverting all of the bits of the codewords, one further bit of information may be conveyed per codeword. This type of coding is known as bi-orthogonal block coding.

A significant feature of such coding is that simultaneous correlation with all the orthogonal block codewords in a set may be performed efficiently by means of a Fast Walsh Transform (FWT) device. In the case of a [128,7] block code, for example, 128 input signal samples are transformed into a 128-point Walsh spectrum in which each point in the spectrum represents the value of the correlation of the input signal samples with one of the codewords in the set. A programmable digital signal processor can readily be configured to calculate Walsh transforms, although use of the FWT is usually more efficient. A suitable FWT processor is described in commonly assigned U.S. patent application No. 07/735,805 filed on Jul. 25, 1991, which is expressly incorporated here by reference.

In a preferred embodiment of the present invention, communication signals are first encoded into 7-bit bytes which are then further encoded using a [128,7] orthogonal Walsh-Hadamard block code in order to produce 128-bit codewords. The codewords for each particular signal are scrambled by modulo-2 addition of a scrambling mask that is unique to each signal. The scrambled codewords are then transmitted bit serially by means of filtering and modulation. A preferred system is described in commonly assigned U.S. patent application No. 07/866,865 filed on Apr. 10, 1992, entitled "Multiple Access Coding for Mobile Radio Communications," which is expressly incorporated here by reference.

The filtering and conversion into I and Q modulation waveforms is preferably performed in the first digital signal processor 110 for all signals using the same frequency channel. The I and Q waveforms are then added together with a weighting factor depending on the relative signal strength with which each signal is to be transmitted because it is logical and advantageous to transmit with a higher signal strength to mobile stations farther away, at extreme range, while transmitting at lower signal strength to mobile stations nearer the base station. The summed I and Q waveforms are then subjected to the correction factors described above before being output by the first digital signal processor to D/A converters 112, 113 for subsequent quadrature modulation by the quadrature modulator 114. The uncorrected I and Q values are also output from the first digital signal processor 110 to the second digital signal processor 125 for comparison with the measured values determined by the modulation assessment receiver.

In this preferred implementation, receivers for the composite CDMA signal radiated by a base station employ the subtractive CDMA technique described above and in the above-cited U.S. patent and patent application. Each mobile station decodes the strongest of the orthogonally coded signals first by descrambling with the scrambling mask of the strongest signal, performing a 128-point FWT, and determining the largest of the 128 transform components to detect which codeword was most likely to have been transmitted. The detected codeword is then subtracted from the composite signal, for example, by setting the largest transform component equal to zero, a 128-point Inverse Fast Walsh Transform (IFWT) is performed, and finally the scrambling code is re-applied. The process is repeated successively on the residual composite Signal using the descrambling code corresponding to the next strongest signal and so on until the mobile station has decoded the signal intended for it. In this way, the stronger signals are prevented from hindering the decoding of the weaker signals they overlap.

When a signal is subtracted, a waveform theoretically corresponding to a perfect modulation is subtracted, leaving as a residual any imperfections in the modulation process. According to this preferred embodiment of the present invention, a subtractive CDMA receiver is used as the modulation assessment receiver for correcting the transmitter modulation imperfections. Moreover, the correction factors can be directly identified with certain transform components produced by the FWT.

The modulation employed to bit-serially transmit the 128-bit scrambled Walsh-Hadamard codewords is preferably Shaped Offset Quadrature Amplitude Modulation (SOQAM), which is related to OQPSK in that even bits are applied to the I phase and odd bits are applied to the Q phase alternately. The sampling points for SOQAM are shown in the I and Q waveforms illustrated in FIG. 9. The desired sampling points shown in FIG. 9 are used in a conventional way to determine the characteristics of the clock signals $f_5$, $f_6$ produced by the reference frequency and timing generator 121. OQPSK is further described in the publication by S. Gronemeyer et al. cited above.

At the receiver, signal samples must, in principle, be taken from the I and Q channels alternately to obtain 128-sample blocks (representing one of the 128 128-bit Walsh-Hadamard block codewords) upon which the FWT is performed. Nevertheless, by applying a pre-rotation of the phase of the received signal amounting to a progressive 90° per bit period, the phases of the even bits are rotated by 0° or 180°, which leaves the even bits in the I channel albeit with half of the even bits inverted, and the phases of the odd bits are rotated by 90° or 270°, which rotates the odd bits from the Q channel into the I channel. After such a pre-rotation, all 128 samples for the FWT can be collected from the same channel (in this example, the I channel). The effect of the pre-rotation is to change the signs of the samples according to the pattern + + − − + + − − + + − − ..., which is the Walsh-Hadamard basis codeword W2. Accordingly, the detected codeword will be offset by a bitwise modulo-2 addition of two from the codeword transmitted by virtue of the mathematical properties of Walsh-Hadamard codewords. It is a simple matter to correct the detected codeword by bitwise modulo-2 subtraction of the offset two. For example, if the decimal data block 73 (binary number 01001001) is transmitted by sending the 128-bit Walsh-Hadamard codeword W73, the data block 75 (binary number 01001011) will be detected due to the pre-rotation effect. Bitwise modulo-2 addition of binary number 00000010 corrects the inverted data bit.

Carrier leakage or I and Q offsets in the quadrature modulator would appear in the transmitted signal as a constant carrier component, which corresponds to unscrambled Walsh-Hadamard codeword W0, but due to pre-rotation this carrier leakage component is converted to correspond to unscrambled Walsh-Hadamard codeword W2. Thus, such leakage or offsets can be detected by descrambling the composite signal with a null scrambling code, performing an FWT, and identifying transform component 2 as the modulator imbalance. This transform component, which may be complex, contains the arbitrary phase introduced by the transmission path, which can be removed by relating it to the known phase of one of the transmitted signals.

In a preferred system, the strongest of the overlapping signals is used as a broadcast (calling) channel communicating with all the mobile stations, and the strongest of the overlapping signals is also used as a pilot or phase-reference signal to which the phase of the other signals and the above-mentioned imbalance measurement can be related. Specifically, if the complex value of the largest detected transform component When decoding the strongest signal is $S_1$, and the measurement of the W2 transform component representing the modulator imbalance yields the complex number K, then the I and Q leakage components $K_i$ and $K_q$, respectively, returned as correction factors to the first digital signal processor 110 are given by:

$$K_i + K_q = S_1 * K = (Re(S_1) - iIm(S_1))(Re(K) + iIm(K)).$$

For the case of relative scaling errors in the I and Q channels, if the I channel modulator produces a larger signal than the Q channel modulator, then alternate signal samples originally in the Q channel will be of smaller amplitude than the intervening signal samples coming from the I channel. This is equivalent to the addition of a small amount of a spurious codeword that differs from the correct codeword by having its Q bits inverted, thereby producing a small degree of destructive addition with the Q bits and a small degree of constructive addition with the I bits. This spurious codeword is thus the transmitted codeword modified by the sign pattern + − + − + − + − + − + − ..., which is the Walsh-Hadamard basis codeword W1. Accordingly, the spurious codeword will be offset by a bitwise modulo-2 addition of one from the codeword transmitted, again by virtue of the mathematical properties of Walsh-Hadamard codewords. Accordingly, by determining the component of the Walsh-Hadamard transform one away from the transmitted codeword, a misscaling between I and Q channels can be identified and corrected.

It will be appreciated that this small spurious component may well be masked by spurious components arising from other signals, but if these are decoded and subtracted first the small error component can more easily be detected. Moreover, separate assessments of the value of the component representing I and Q relative mis-scaling can be made relative to the main decoded codeword after decoding of each of the overlapping signals. The values can then be averaged over all the codewords decoded from one block of 128 signal samples, as well as averaged over many signal blocks in order to average out the above-mentioned sources of spurious error that would otherwise mask the small component representing I and Q relative mis-scaling.

The component of the average that is in-phase with the transmitted codeword that is detected represents the mis-scaling factor A, while the component in quadrature to detected codewords represents the correction factor T for errors in the 90°-phase-splitting network 103 in the quadrature modulator. Thus, by intelligently using information provided by the Walsh transform signal decoder, all the errors in the quadrature modulator can be determined and appropriate correction factors transmitted to the modulating first digital signal processor 110 in order for the first digital signal processor to take the corrective actions described above. In this way, it is possible to ensure that the composite modulation produced by the base station accurately conforms to the desired theoretical form.

While particular embodiments of the present invention have been described and illustrated, it should be understood that the invention is limited only by the attached claims. Since modifications may be made by persons skilled in the art, the present application contemplates any and all modifications that fall within the spirit and scope of the invention disclosed and claimed herein.

What is claimed is:

1. An adaptively precompensated quadrature modulator for accurately forming a modulated transmitted signal, comprising:
   first digital signal processing means for applying correction factors to uncorrected samples of an in-phase modulation waveform and a quadrature modulation waveform to generate corrected samples and for converting corrected samples into a corrected in-phase modulation waveform and a corrected quadrature modulation waveform;
   a quadrature modulator for impressing the corrected in-phase modulation waveform on a substantially cosinusoidal carrier wave and for impressing the corrected quadrature modulation waveform on a substantially sinusoidal carrier wave, the quadrature modulator producing a modulated output signal;
   transmitter means for upconverting and amplifying the modulated output signal of said quadrature modulator to a predetermined transmission frequency and power level, the transmitter means producing the modulated transmitted signal;
   modulation assessment receiving means, coupled to said transmitter means, for generating digitized samples of the modulated transmitted signal; and
   second digital signal processing means, in communication with said first digital signal processing means and with said modulation assessment receiving means, for determining the correction factors based on said digitized samples generated by said modulation assessment receiving means and on the uncorrected samples and for communicating the correction factors to the first digital signal processing means.

2. The adaptively precompensated quadrature modulator of claim 1, wherein said first digital signal processing means includes at least one digital-to-analog converter for converting the corrected samples to said in-phase modulation waveform and quadrature modulation waveform impressed by said quadrature modulator on said carrier waves.

3. The adaptively precompensated quadrature modulator of claim 2, wherein said digital-to-analog converter uses substantially highly oversampled delta-sigma modulation.

4. The adaptively precompensated quadrature modulator of claim 1, wherein said digitized samples generated by said modulation assessment receiving means comprise samples in, alternatively, polar and log-polar formats.

5. The adaptively precompensated quadrature modulator of claim 4, wherein said second digital signal processing means converts said digitized samples generated by said modulation assessment receiving means to cartesian format.

6. The adaptively precompensated quadrature modulator of claim 1, wherein said in-phase and quadrature modulation waveforms comprise a spread-spectrum coded signal.

7. The adaptively precompensated quadrature modulator of claim 6, wherein said spread-spectrum coded signal comprises a sum of a plurality of second spread-spectrum coded signals.

8. The adaptively precompensated quadrature modulator of claim 7, wherein said second digital signal processing means performs a Walsh transform in determining said correction factors.

9. The adaptively precompensated quadrature modulator of claim 7, wherein said second spread-spectrum coded signals include a plurality of [128,7] Walsh-Hadamard codewords.

10. The adaptively precompensated quadrature modulator of claim 7, wherein said second spread-spectrum coded signals include a plurality of [128,8] Walsh-Hadamard codewords.

11. The adaptively precompensated quadrature modulator of claim 1, wherein said second digital signal processing means performs a Walsh transform in determining said correction factors.

12. The adaptively precompensated quadrature modulator of claim 1, wherein said modulated output signal comprises one of a Quadrature Phase Shift Keying signal, an Offset Quadrature Phase Shift Keying signal, a Shaped Offset Quadrature Phase Shift Keying signal, a Quadrature Amplitude Modulation signal, an Offset Quadrature Amplitude Modulation signal, and a Shaped Offset Quadrature Amplitude Modulation signal.

13. An adaptively precompensated quadrature modulation method for accurately forming a modulated signal, comprising the steps of:
   (a) applying a set of correction factors to uncorrected in-phase and quadrature modulation waveform samples to produce corrected in-phase and quadrature modulation samples;
   (b) forming a corrected in-phase modulation waveform from the corrected in-phase modulation samples and modulating a substantially cosinusoidal carrier wave with the corrected in-phase modulation waveform, forming a corrected quadrature modulation waveform from the corrected quadrature modulation samples and modulating a substantially sinusoidal carrier wave with the corrected quadrature modulation waveform, and forming a modulated output signal by summing the modulated cosinusoidal and sinusoidal carrier waves;

(c) forming a modulated transmitted signal by upconverting and amplifying the modulated output signal to a selected desired transmission frequency and power level;

(d) collecting digital samples of the modulated transmitted signal; and (e) determining the set of correction factors from said digital samples and the uncorrected samples.

14. The method of claim 13, wherein the forming step (b) includes the step of converting the corrected in-phase and quadrature waveform samples to an analog form.

15. The method of claim 14, wherein said converting step comprises substantially highly oversampled delta-sigma modulation.

16. The method of claim 13, wherein said digitized samples comprise, alternatively, polar and log-polar representations.

17. The method of claim 16, wherein step (c) includes the step of converting the, alternatively, polar and log-polar representations to cartesian representation.

18. The method of claim 13, wherein the modulated output signal comprises a spread-spectrum coded signal.

19. The method of claim 18, wherein step (e) comprises the step of performing a Walsh transform on said digitized samples to determine said correction factors.

20. The method of claim 18, wherein said spread-spectrum coded signal includes a plurality of [128,7] Walsh-Hadamard codewords.

21. The method of claim 20, wherein said spread-spectrum signal includes a plurality of [128,8] Walsh-Hadamard codewords.

22. The method of claim 13, wherein said modulated output signal comprises one of a Quadrature Phase Shift Keying signal, an Offset Quadrature Phase Shift Keying signal, a Shaped Offset Quadrature Phase Shift Keying signal, a Quadrature Amplitude Modulation signal, an Offset Quadrature Amplitude Modulation signal, and a Shaped Offset Quadrature Amplitude Modulation signal.

23. The method of claim 13, wherein step (e) includes the step of performing a Walsh transform on said digitized samples to determine said correction factors.

24. An adaptively precompensated quadrature modulator for accurately forming a modulated signal, comprising:

a first processor that applies correction factors to uncorrected samples of an in-phase modulation waveform and a quadrature modulation waveform, thereby generating corrected samples, and that converts the corrected samples into a corrected in-phase modulation waveform and a corrected quadrature modulation waveform;

a quadrature modulator that impresses the corrected in-phase modulation waveform on a substantially cosinusoidal carrier wave and that impresses the corrected quadrature modulation waveform on a substantially sinusoidal carrier wave, thereby producing the modulated signal;

a modulation assessment receiver, coupled to the quadrature modulator, that generates digitized samples of the modulated signal; and a second processor that is coupled to the first processor and the modulation assessment receiver, that determines the correction factors based on the digitized samples and the uncorrected samples, and that communicates the correction factors to the first processor.

25. The adaptively precompensated quadrature modulator of claim 24, wherein the first processor includes at least one digital-to-analog converter that converts the corrected samples into the corrected in-phase modulation waveform and the corrected quadrature modulation waveform.

* * * * *